(12) United States Patent
Ide

(10) Patent No.: US 9,774,334 B2
(45) Date of Patent: Sep. 26, 2017

(54) CLOCK RECOVERY CIRCUIT, OPTICAL MODULE, AND CLOCK RECOVERY METHOD

(71) Applicant: FUJITSU LIMITED, Kawasaki-shi, Kanagawa (JP)

(72) Inventor: Satoshi Ide, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/263,430

(22) Filed: Sep. 13, 2016

(65) Prior Publication Data
US 2017/0104492 A1 Apr. 13, 2017

(30) Foreign Application Priority Data
Oct. 8, 2015 (JP) .................................. 2015-200384

(51) Int. Cl.
| | | |
|---|---|---|
| H03D 7/08 | (2006.01) |
| H03L 7/08 | (2006.01) |
| H03L 7/089 | (2006.01) |
| H03L 7/099 | (2006.01) |
| H04B 10/25 | (2013.01) |
| H04B 10/61 | (2013.01) |
| H04L 7/00 | (2006.01) |
| H04L 7/033 | (2006.01) |

(52) U.S. Cl.
CPC .......... *H03L 7/0807* (2013.01); *H03L 7/0891* (2013.01); *H03L 7/099* (2013.01); *H04B 10/25* (2013.01); *H04B 10/616* (2013.01); *H04L 7/0075* (2013.01); *H04L 7/0091* (2013.01); *H04L 7/033* (2013.01)

(58) Field of Classification Search
CPC ..... H04L 7/033; H04L 7/0008; H04L 7/0337; H04L 7/0331; G06F 1/10; G06F 13/1689; H03L 7/0891; H03L 7/087; H03L 7/091; H03L 2207/50; H03L 7/0814
USPC ......................................................... 398/115
See application file for complete search history.

(56) References Cited

U.S. PATENT DOCUMENTS

| 2002/0153476 A1* | 10/2002 | Rokugawa | .............. H03L 7/085 |
| | | | 250/214 A |
| 2003/0133522 A1* | 7/2003 | Staszewski | ............. H03L 7/085 |
| | | | 375/345 |

(Continued)

FOREIGN PATENT DOCUMENTS

| JP | 57-210718 | 12/1982 |
| JP | 61-131130 U | 8/1986 |
| JP | 06-125251 | 5/1994 |

*Primary Examiner* — Don N Vo
(74) *Attorney, Agent, or Firm* — Fujitsu Patent Center

(57) ABSTRACT

A VCO generates a clock signal. A phase and frequency detector compares phases and frequencies of the clock signal generated by the VCO and an input signal. A charge pump adjusts a control voltage of the VCO based on an output of the phase and frequency detector. An identical digit detector generates a first signal by delaying a rising timing of the input signal by a first time, generates a second signal by delaying a falling timing of the input signal by a second time, detects succession of identical digits in the input signal based on the first signal and the second signal, and stops adjustment of the control voltage by the charge pump when the identical digits succeed by a predetermined number of identical digits or more.

10 Claims, 12 Drawing Sheets

(56) References Cited

U.S. PATENT DOCUMENTS

2010/0134158 A1* 6/2010 Pignol .................... H03L 7/083
                                                            327/156
2015/0029800 A1* 1/2015 Iijima ................ H03K 19/0016
                                                            365/193

* cited by examiner

FIG.14
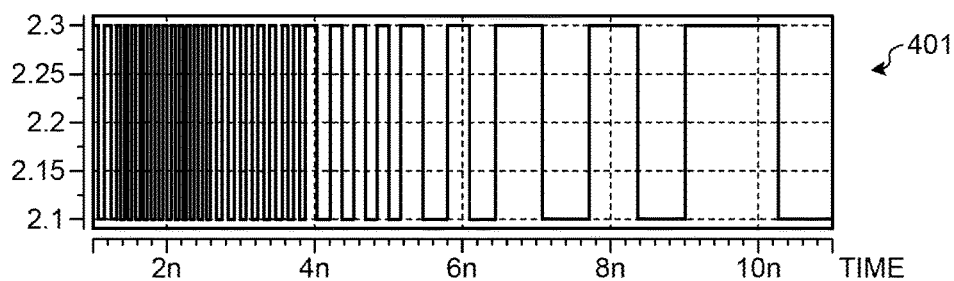
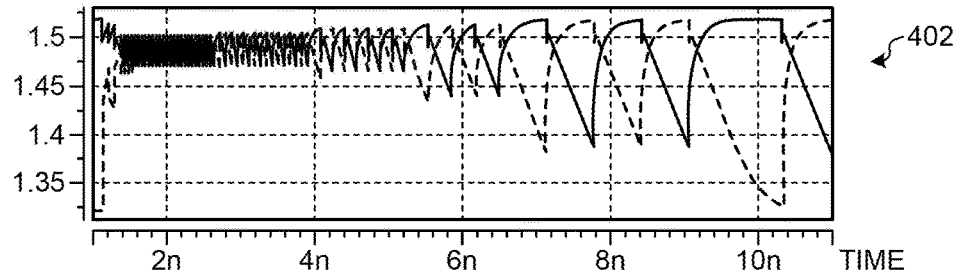
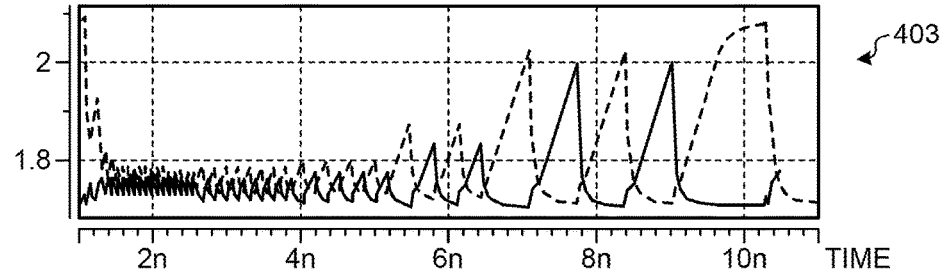
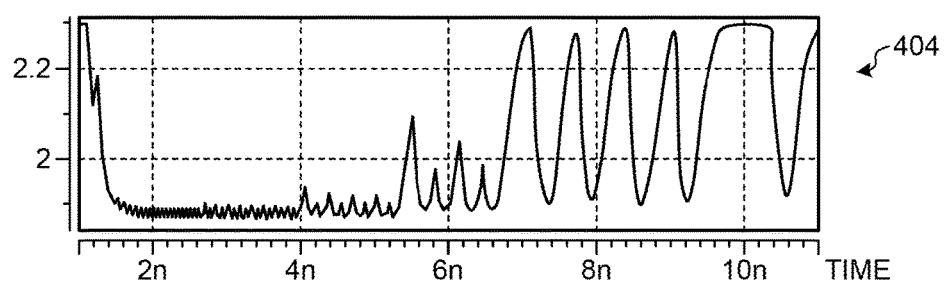

FIG.15
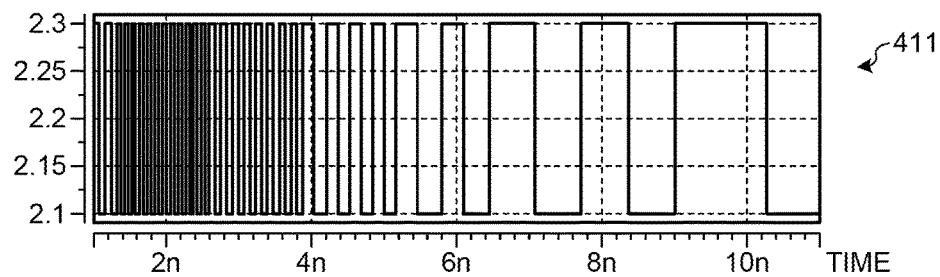
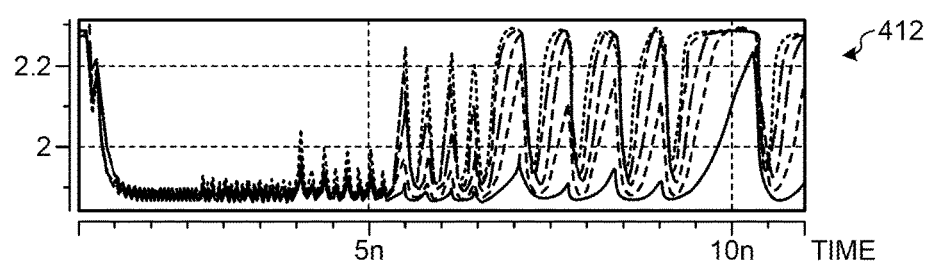
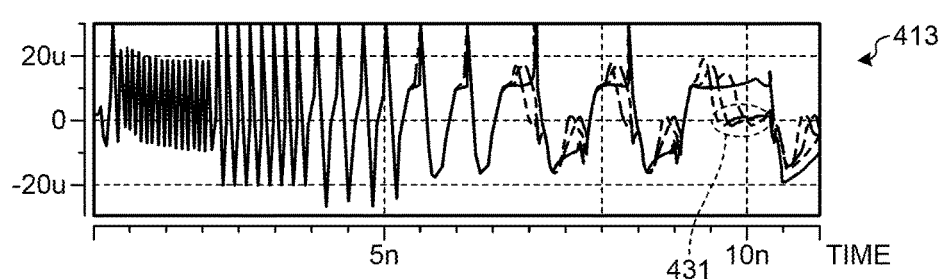
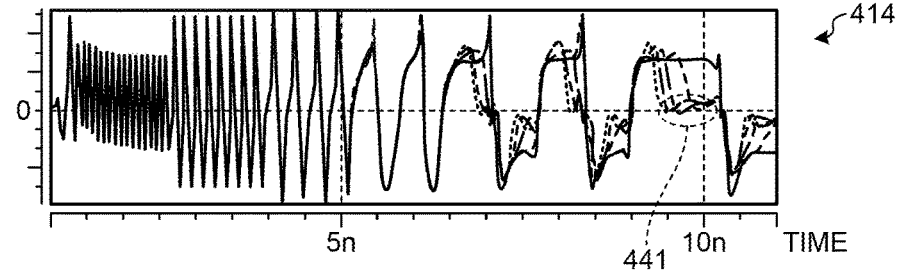

FIG.16
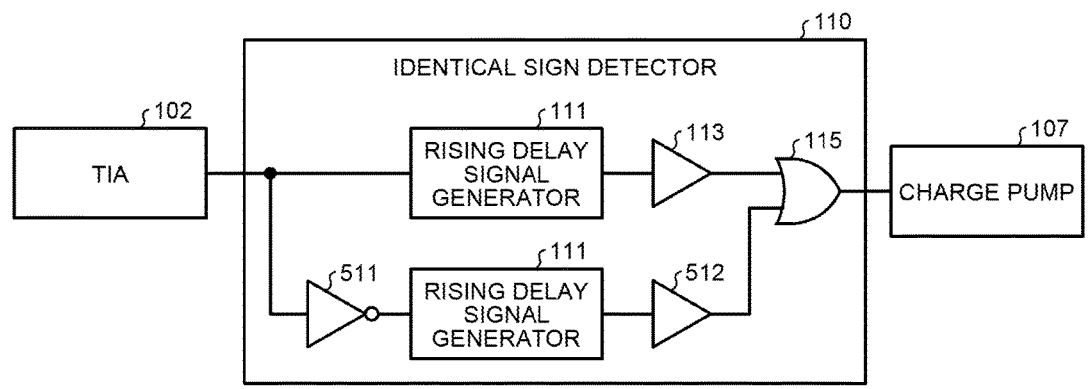
FIG.17
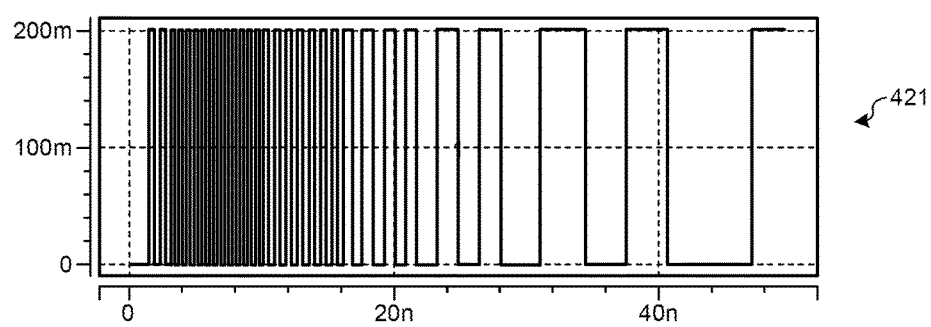
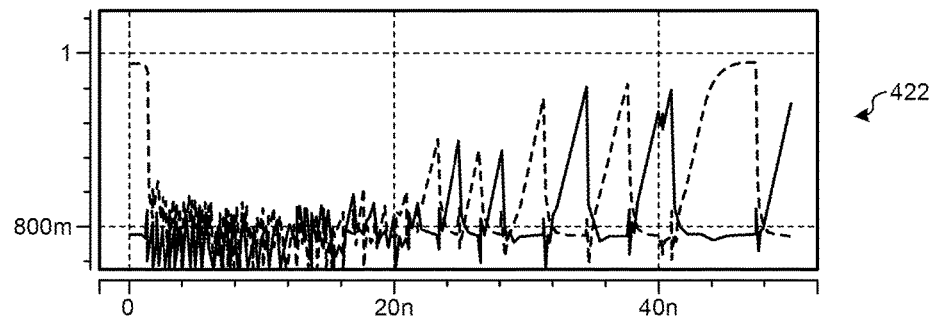

CLOCK RECOVERY CIRCUIT, OPTICAL MODULE, AND CLOCK RECOVERY METHOD

CROSS-REFERENCE TO RELATED APPLICATION

This application is based upon and claims the benefit of priority of the prior Japanese Patent Application No. 2015-200384, filed on Oct. 8, 2015, the entire contents of which are incorporated herein by reference.

FIELD

The embodiments discussed herein are related to a clock recovery circuit, an optical module, and a clock recovery method.

BACKGROUND

With recent improvement in signal transmission speed and a recent increase in signal transmission capacity between information processing devices in high-end servers or supercomputers, optical interconnection using a high-speed optical transmission technique in short-range or middle-range signal transmission between CPUs has been studied in order to break a limit of electrical signal transmission. In the optical interconnection, an optical module or the like that converts an electrical signal into an optical signal is employed and data is transmitted between a transmitting-side optical transmission device and a receiving-side optical transmission device using an optical signal via a transmission line such as an array optical fiber. Regarding a signal speed, there is a need for high-speed data communication of, for example, 25 Gb/s so as to cope with wide-band signal transmission between the information processing devices.

In order to satisfactorily transmit and receive digital signals, there is a need for determining each data bit at a correct timing in a receiving-side information processing device. Accordingly, the receiving-side information processing device determines data using timing information for determining a timing at which data is read. As a simple unit that acquires the timing information, there is a method of causing a transmitting-side information processing device to transmit a clock signal in parallel with a data signal.

On the other hand, in recent high-speed data communication such as optical interconnection, since it is difficult to combine a clock timing transmitted in parallel with data due to a transmission delay, transmission of a clock signal in parallel with a data signal is not performed, but a method of embedding clock information in a data signal and causing a receiving-side information processing device to recover a clock is often used. Regeneration of a clock is performed by a clock recovery circuit of the receiving-side information processing device.

A phase-locked loop (PLL) circuit or the like is used in the clock recovery circuit, and the phase-locked loop circuit includes a phase/frequency detector, a loop filter, and a voltage-controlled oscillator (VCO). A clock signal is recovered by adjusting a control voltage of a clock VCO through comparison with a phase of an internal clock signal at data edges which are a rising edge and a falling edge of a received data signal using the phase-locked loop circuit.

A technique of generating an edge pulse in which a rising edge and a falling edge of a reference pulse are delayed by a predetermined time in order to detect data edges of a data signal is known in the related art. In addition, a technique of detecting edges using a NOR circuit or a NAND circuit and an inverter circuit is known in the related art.

Patent Document 1: Japanese Laid-open Patent Publication No. 57-210718
Patent Document 2: Japanese Laid-open Utility Model Publication No. 61-131130
Patent Document 3: Japanese Laid-open Patent Publication No. 06-125251

In a clock recovery circuit using the above-mentioned phase-locked loop circuit, when there is no data edge, phase comparison at that time is not performed and adjustment of a clock signal is not performed. Accordingly, when identical digits succeed as a data signal for a long time, a control voltage of a clock VCO varies and a phase shift, that is, a jitter, of a clock signal occurs. Accordingly, there is a possibility that data will not be determined at a correct timing and a bit error or the like will occur, thereby causing degradation in transmission quality.

Therefore, it is considered that the degradation in transmission quality is reduced by detecting succession of identical digits in an input data signal and stopping the phase-locked loop circuit during the succession of identical digits.

However, in the technique of adding a predetermined delay to an edge pulse or the technique using a NOR circuit or a NAND circuit and an inverter circuit, the succession of identical digits is not detected. Accordingly, it is difficult to reduce the degradation in transmission quality when identical digits succeed in a data signal.

SUMMARY

According to an aspect of an embodiment, a clock recovery circuit includes: a voltage-controlled oscillator that generates a clock signal; a phase and frequency detector that compares phases and frequencies of the clock signal generated by the voltage-controlled oscillator and an input signal; a voltage adjuster that adjusts a control voltage of the voltage-controlled oscillator based on an output of the phase and frequency detector; a first signal generator that generates a first signal by delaying a rising timing of the input signal by a first time; a second signal generator that generates a second signal by delaying a falling timing of the input signal by a second time; and a controller that detects succession of identical digits in the input signal based on the first signal and the second signal and stops adjustment of the control voltage by the voltage adjuster when identical digits succeed by a predetermined number of identical digits or more.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 14 is a diagram illustrating a simulation result of an identical digit detection signal in the clock recovery circuit when an identical digit detector illustrated in FIG. 13 is used;

FIG. 15 is a diagram illustrating a simulation result of an identical digit detection signal when a delay time is changed;

FIG. 16 is a block diagram when a rising delay circuit is used as a "first signal generator" and a "second signal generator"; and FIG. 17 is a diagram illustrating a simulation result of an identical digit detection signal in the clock recovery circuit when a rising delay circuit is used.

DESCRIPTION OF EMBODIMENTS

Preferred embodiments of the present invention will be explained with reference to accompanying drawings. The clock recovery circuit, the optical module, and the clock recovery method disclosed in the present application are not limited by the following embodiments.

[a] First Embodiment

Figure 1:
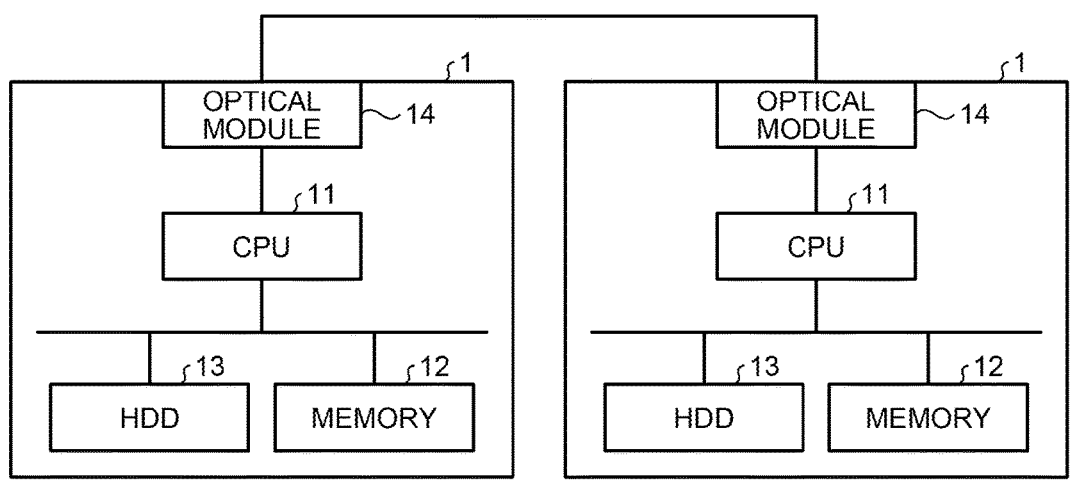
FIG. 1 is a diagram illustrating an example of a system configuration of an information system using an optical module.

FIG. 1 is a diagram illustrating an example of a system configuration of an information system using an optical module. As illustrated in FIG. 1, an optical module 14 is used for communication between information processing devices 1 such as servers. The optical modules 14 of the information processing devices 1 are connected to each other using an optical communication cable such as an optical fiber.

A CPU 11 mounted on the information processing device 1 performs a computing process using a memory 12, an HDD 13, and the like. The CPU 11 communicates with another information processing device 1 via the optical module 14. The optical module 14 performs communication, for example, using Ethernet (registered trademark).

Specifically, the CPU 11 supplies a data signal to be transmitted to another information processing device 1 to the optical module 14. At this time, the CPU 11 embeds a clock signal in the data signal. Then, the optical module 14 converts the data signal received from the CPU 11 from an electrical signal to an optical signal. The optical module 14 outputs the data signal converted into the optical signal to the optical module 14 of another information processing device 1.

When an optical signal is received from the optical module 14 of another information processing device 1, the optical module 14 converts the received data signal into an electrical signal. The optical module 14 according to this embodiment converts the optical signal into the electrical signal and recovers a clock from the electrical data signal. Thereafter, the optical module 14 determines the received data signal using the recovered clock. The optical module 14 transmits the determined data signal to the CPU 11.

While a server or the like is exemplified as the information processing device 1, the information processing device 1 may be another device as long as it transmits and receives a data signal and may be, for example, a storage. The optical module 14 may receive a data signal from a unit other than the CPU 11. The clock recovery circuit is not limited to the optical module, but may be a circuit of transmitting and receiving an electrical signal.

The optical module 14 of the information processing device 1 may be on any one of a data transmitting-side and a data receiving side. In the following description, it is assumed that one of the optical modules communicating with each other is a transmitting-side optical module and the other is a receiving-side optical module. That is, the optical module 14 practically has both functions of the transmitting-side optical module and the receiving-side optical module in the following description.

Figure 2:
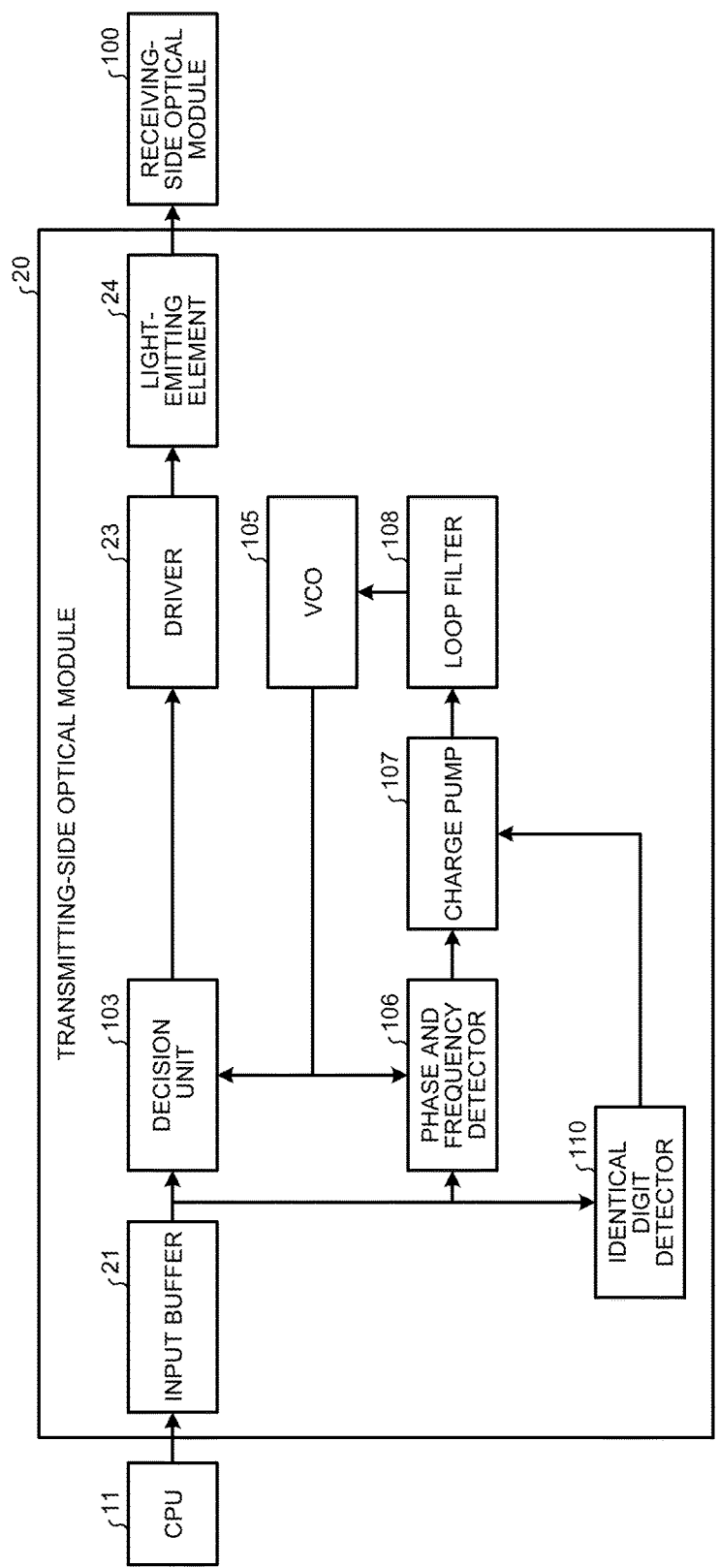
FIG. 2 is a block diagram of a transmitting-side optical module.

FIG. 2 is a block diagram illustrating a transmitting-side optical module. A transmitting-side optical module 20 includes an input buffer 21, a decision unit 103, a driver 23, and a light-emitting element 24. The transmitting-side optical module 20 further includes a VCO 105, a phase and frequency detector 106, a charge pump 107, a loop filter 108, and an identical sign detector 110. Here, for example, a circuit including the VCO 105, the phase and frequency detector 106, the charge pump 107, the loop filter 108, and the identical digit detector 110 corresponds to an example of the "clock recovery circuit."

The input buffer 21 receives an input of a data signal from the CPU 11. The input buffer 21 performs shaping of the received signal. Thereafter, the input buffer 21 outputs the data signal to the decision unit 103. Here, the data signal output from the input buffer 21 includes noise or jitter due to signal transmission from the CPU 11 to the optical module 14 and is not a data signal having accurate information.

The decision unit 103 is constituted, for example, by a flip-flop (FF). The decision unit 103 receives an input of the data signal from the input buffer 21. The decision unit 103 receives an input of a clock signal generated by the VCO 105 to be described later. The decision unit 103 identifies the received data signal. That is, the decision unit 103 determines the data signal at the timing indicated by the acquired clock signal and determines information of the data signal. The decision by the decision unit 103 may be referred to as retiming. The data signal has accurate data through decision by the decision unit 103. The decision unit 103 outputs the data signal having information determined to the driver 23.

The driver 23 receives an input of the data signal from the decision unit 103. Then, the driver 23 controls the light-emitting element 24 depending on the acquired data signal.

The light-emitting element 24 is, for example, a vertical cavity surface emitting laser (VCSEL). The light-emitting element 24 outputs an optical signal corresponding to the data signal to a receiving-side optical module 100 via an optical fiber under the control of the driver 23.

The VCO 25 is an oscillator of which an oscillation frequency varies depending on an input control voltage. The VCO 25 receives an input of a voltage from the loop filter 108. The VCO 25 generates a clock signal by oscillating depending on the input voltage. The clock signal generated by the VCO 25 is output to the decision unit 103 and the phase and frequency detector 107.

The phase and frequency detector 26 receives an input of the clock signal from the VCO 25. The phase and frequency detector 26 acquires the data signal output from the input buffer 21. The phase and frequency detector 26 compares frequencies and phases of the data signal and the clock signal. Thereafter, the phase and frequency detector 26 outputs the comparison result, that is, a signal proportional to an error between the data signal and the clock signal, to the charge pump 27. Specifically, the phase and frequency detector 26 outputs a degree of adjustment of the voltage to be input to the VCO 25, that is, information indicating how much the voltage is raised or lowered, depending on the error to the charge pump 27.

The charge pump 27 receives an input of the degree of adjustment of the voltage to be input to the VCO 25 from the phase and frequency detector 26. The charge pump 27 causes the loop filter 28 to perform charging and discharging of charges depending on the input degree of adjustment. The charge pump 107 corresponds to an example of the "voltage adjuster."

The loop filter 28 performs charging and discharging of charges under the control of the charge pump 27 and removes noise. The loop filter 28 inputs a control voltage to the VCO 25 depending on an amount of charges held therein.

The identical digit detector 110 acquires the data signal output from the input buffer 21. Then, the identical digit detector 110 determines whether data of identical digits succeed by a predetermined number in the data signal. When the data of identical digit succeed by a predetermined number, the identical digit detector 110 stops the operation of the charge pump 107. Thereafter, when the sign of the data is changed, the identical digit detector 110 restarts the operation of the charge pump 107.

Figure 3:
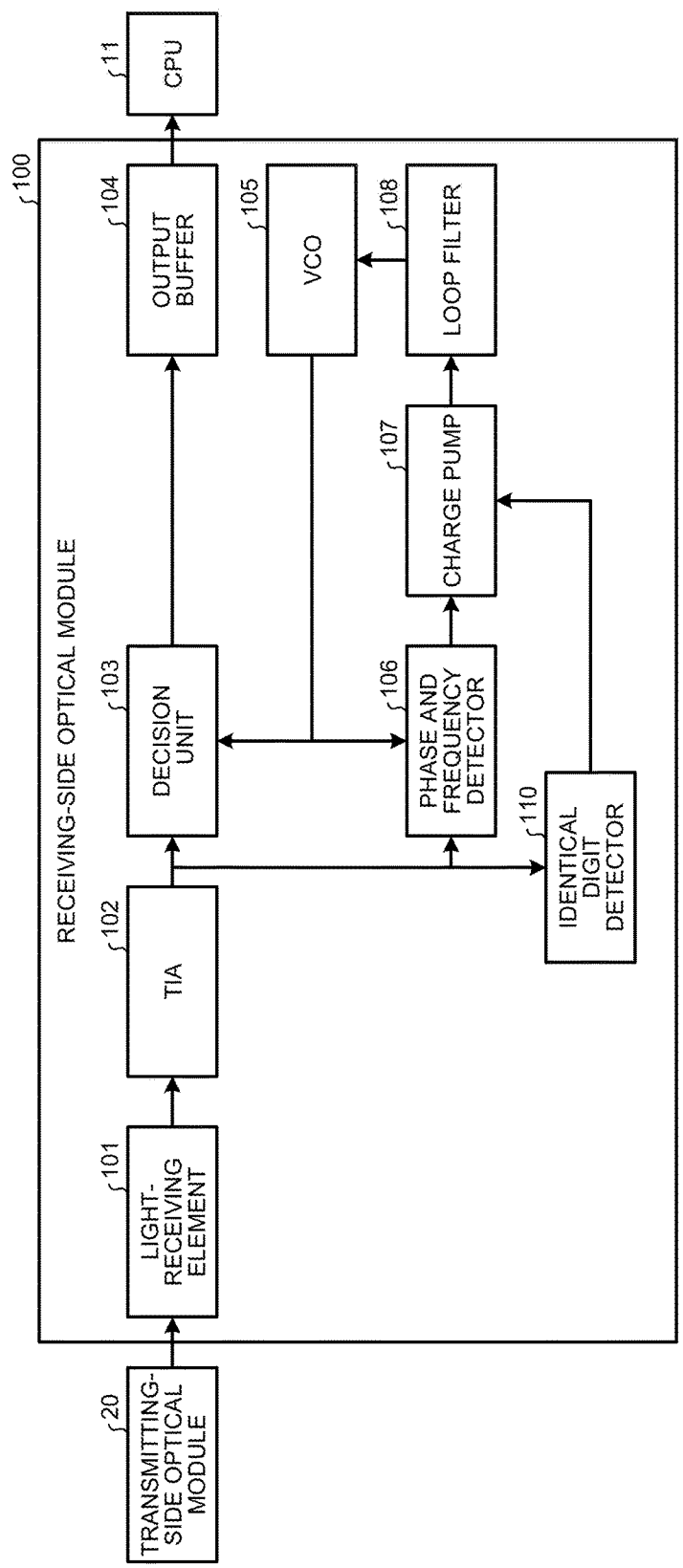
FIG. 3 is a block diagram of a receiving-side optical module.

The receiving-side optical module 100 will be described below with reference to FIG. 3. FIG. 3 is a block diagram of the receiving-side optical module.

The receiving-side optical module 100 includes a light-receiving element 101, a trans impedance amplifier (TIA) 102, the decision unit 103, an output buffer 104, the VCO 105, the phase and frequency detector 106, the charge pump 107, the loop filter 108, and the identical digit detector 110. Here, for example, a circuit including the VCO 105, the phase and frequency detector 106, the charge pump 107, the loop filter 108, and the identical digit detector 110 corresponds to an example of the "clock recovery circuit."

The light-receiving element 101 is, for example, a photo diode (PD). The light-receiving element 101 receives the optical signal output from the transmitting-side optical module 20 via an optical fiber. Then, the light-receiving element 101 converts a data signal which is the received optical signal into a current. Then, the light-receiving element 101 outputs the data signal converted into the current to the TIA 102.

The TIA 102 receives an input of the data signal converted into the current from the light-receiving element 101. Then, the TIA 102 converts the data signal as the current in impedance, amplifies the data signal, and converts the data signal into a voltage. Then, the TIA 102 outputs the data signal converted into the voltage to the decision unit 103.

The decision unit 103 is constituted, for example, by a FF. The decision unit 103 receives an input of the data signal from the TIA 102. The decision unit 103 receives an input of a clock signal generated by the VCO 105 to be described later. The decision unit 103 identifies the received data signal. That is, the decision unit 103 determines the data signal at the timing indicated by the acquired clock signal and determines information of the data signal. The decision unit 103 outputs the data signal having information determined to the output buffer 104.

The output buffer 104 receives an input of the data signal from the decision unit 103. Then, the output buffer 104 adjusts the current which flows as the data signal and outputs the data signal as an electrical signal to the CPU 11.

The VCO 105 is an oscillator of which an oscillation frequency varies depending on an input control voltage. The VCO 105 receives an input of a voltage from the loop filter 108. The VCO 105 generates a clock signal by oscillating depending on the input voltage. The clock signal generated by the VCO 105 is output to the decision unit 103 and the phase and frequency detector 106.

The phase and frequency detector 106 receives an input of the clock signal from the VCO 105. The phase and frequency detector 106 acquires the data signal output from the TIA 102. The phase and frequency detector 106 compares frequencies and phases of the data signal and the clock signal. Thereafter, the phase and frequency detector 106 outputs the comparison result, that is, a signal proportional to an error between the data signal and the clock signal, to the charge pump 107. Specifically, the phase and frequency detector 106 outputs a degree of adjustment of the voltage to be input to the VCO 105, that is, information indicating how much the voltage is raised or lowered, depending on the error to the charge pump 107.

The charge pump 107 receives an input of the degree of adjustment of the voltage to be input to the VCO 105 from the phase and frequency detector 106. The charge pump 107 causes the loop filter 108 to perform charging and discharging of charges depending on the input degree of adjustment. The charge pump 107 corresponds to an example of the "voltage adjuster."

The loop filter 108 performs charging and discharging of charges under the control of the charge pump 107 and removes noise. The loop filter 108 inputs a control voltage to the VCO 105 depending on an amount of charges held therein.

The identical digit detector 110 acquires the data signal output from the TIA 102. Then, the identical digit detector 110 determines whether data of identical digits succeed by a predetermined number in the data signal. When the data of identical digits succeed by a predetermined number, the identical digit detector 110 stops the operation of the charge pump 107. Thereafter, when the sign of the data is changed, the identical digit detector 110 restarts the operation of the charge pump 107. Details of the identical digit detector 110 will be described below by exemplifying the receiving-side optical module. The identical digit detecting operation is the same as in the transmitting-side optical module 20 or a clock recovery circuit of an electrical signal.

Figure 4:
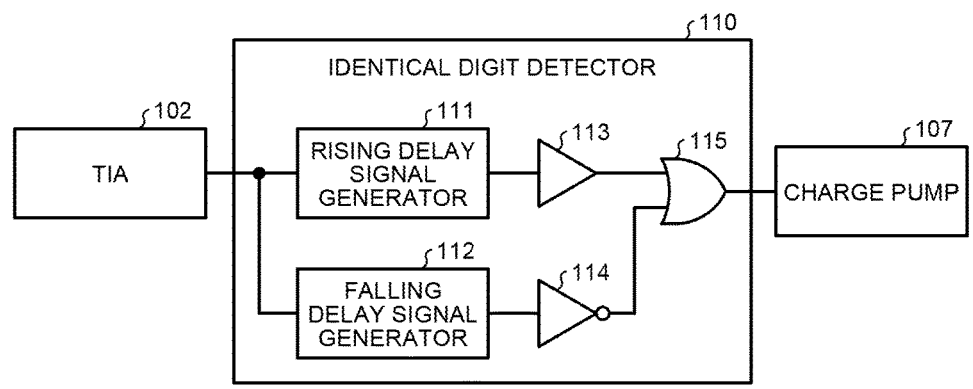
FIG. 4 is a block diagram of an identical digit detector.

FIG. 4 is a block diagram of the identical digit detector. As illustrated in FIG. 4, the identical digit detector 110 includes a rising delay signal generator 111, a falling delay signal generator 112, a buffer 113, a buffer 114, and an OR circuit 115.

Figure 5:
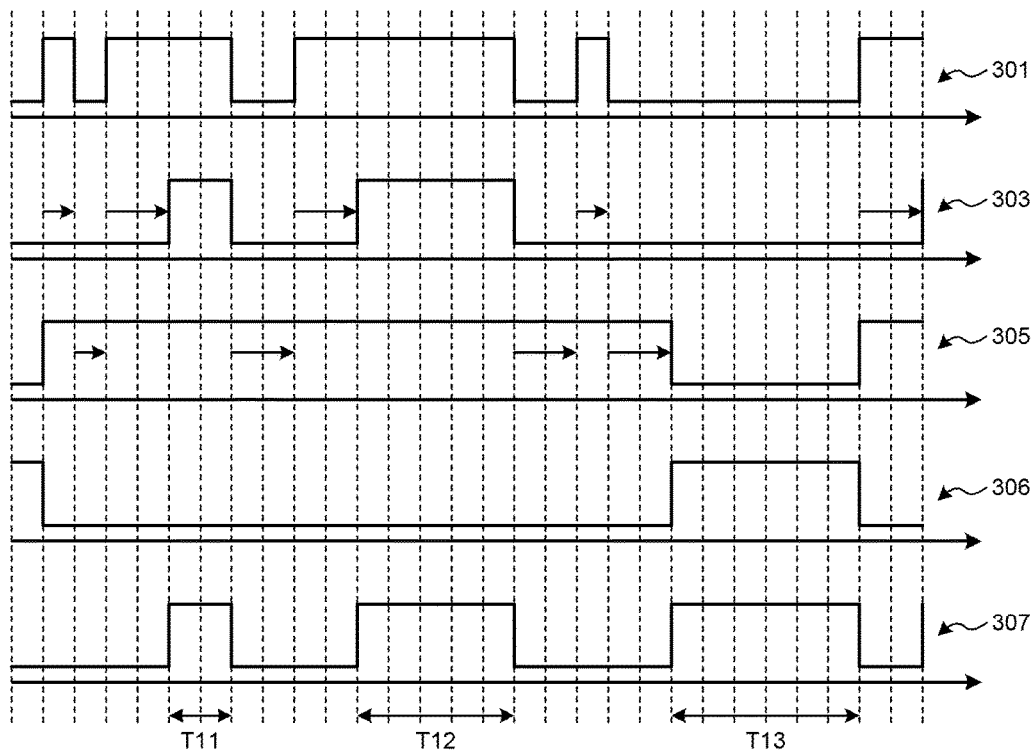
FIG. 5 is a diagram illustrating generation of an identical digit detection signal.

The rising delay signal generator 111 is a circuit that generates a rising delay signal having a waveform in which a rising timing of the data signal acquired from the TIA 102 is delayed by a predetermined time. FIG. 5 is a circuit diagram illustrating an example of the rising delay signal generator. The rising delay signal generator 111 outputs the generated rising delay signal to the buffer 113. The rising delay signal generator 111 corresponds to an example of the "first signal generator." The rising delay signal corresponds to an example of the "first signal," and the predetermined time which is the rising delay time of the waveform of the rising delay signal relevant to a rising of the data signal corresponds to an example of the "first time."

The buffer 113 receives an input of the rising delay signal from the rising delay signal generator 111. Then, the buffer 113 outputs the rising delay signal to the OR circuit 115.

The falling delay signal generator 112 is a circuit that generates a falling delay signal having a waveform in which a falling timing of the data signal acquired from the TIA 102 is delayed by a predetermined time. The falling delay signal generator 112 outputs the generated falling delay signal to the buffer 114. The falling delay signal generator 112 corresponds to an example of the "second signal generator." The falling delay signal corresponds to an example of the "second signal," and the predetermined time which is the falling delay time of the waveform of the falling delay signal relevant to a falling of the data signal corresponds to an example of the "second time."

The buffer 114 receives an input of the falling delay signal from the falling delay signal generator 112. Thereafter, the buffer 114 inverts the falling delay signal. Then, the buffer 114 outputs the inverted falling delay signal to the OR circuit 115.

The OR circuit 115 receives an input of the rising delay signal from the buffer 113. The OR circuit 115 receives an input of the inverted falling delay signal from the buffer 114. Then, the OR circuit 115 calculates a logical OR of the rising delay signal and the inverted falling delay signal and generates an identical digit detection signal. Then, the OR circuit 115 outputs the identical digit detection signal to the charge pump 107. When the value of the identical digit detection signal output from the OR circuit 115 is high, the charge pump 107 stops its operation. That is, when it is determined that the identical digit succeed by a predetermined number, the OR circuit 115 sets the identical digit detection signal to be high to stop the operation of the charge pump 107. The OR circuit 115 corresponds to an example of the "controller."

Generation of the identical digit detection signal will be described below in brief with reference to FIG. 5. FIG. 5 is a diagram illustrating the generation of the identical digit detection signal. In FIG. 5, the vertical axis represents a voltage and the horizontal axis represents the lapse of time.

Here, an example in which a signal having a waveform indicated by graph 301 is the data signal input from the TIA 102 will be described.

Graph 303 indicates a rising delay signal which is generated from the signal indicated by graph 301 by the rising delay signal generator 111. The rising delay signal generator 111 delays the rising of the signal indicated by graph 301 by a predetermined time. In the signal of graph 301, a waveform in which the falling occurs within the delay time from occurrence of the rising is crushed, and the rising timing of a waveform in which the falling occurs after the delay time elapses is delayed by the delay time. Accordingly, the rising delay signal generator 111 generates the rising delay signal indicated by graph 303.

Graph 305 indicates a falling delay signal which is generated from the signal indicated by graph 301 by the falling delay signal generator 112. The falling delay signal generator 112 delays the falling of the signal indicated by graph 301 by a predetermined time. In the signal of graph 301, a waveform in which the rising occurs within the delay time from occurrence of the falling is crushed, and the rising timing of a waveform in which the rising occurs after the delay time elapses is delayed by the delay time. Accordingly, the falling delay signal generator 112 generates the falling delay signal indicated by graph 305.

Graph 306 indicates a signal which is acquired by causing the buffer 114 to invert the falling delay signal indicated by graph 305.

The OR circuit 115 receives an input of the rising delay signal indicated by graph 303 and an input of the inverted falling delay signal indicated by graph 306. Then, the OR circuit 115 calculates the logical OR of the signal indicated by graph 303 and the signal indicated by graph 306 and generates an identical digit detection signal indicated by graph 307.

When a high signal is input from the identical digit detector 110, the charge pump 107 stops its operation. That is, in a high part of the identical digit detection signal indicated by graph 307, the identical digit detector 110 stops the operation of the charge pump 107. In other words, the identical digit detector 110 determines that identical digits succeed by a predetermined number in periods T11, T12, and T13, and stops the operation of the charge pump 107 in the periods.

Figure 6:
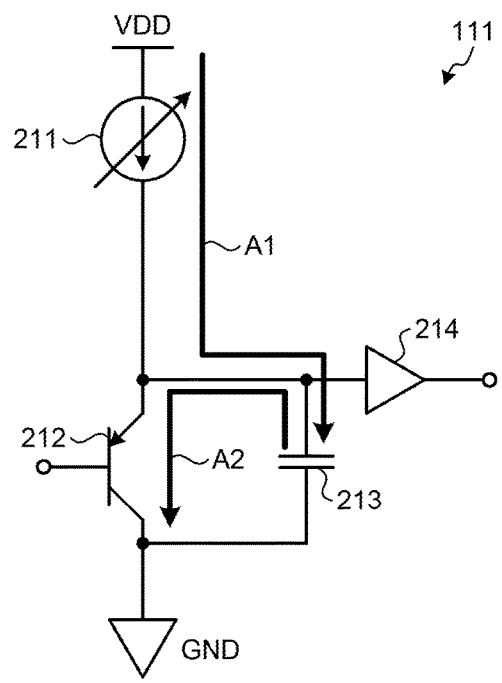
FIG. 6 is a circuit diagram illustrating an example of a rising delay signal generator.

Details of the operation of the rising delay signal generator 111 as an example of the "first signal generator" will be described below with reference to FIG. 6. For example, as illustrated in FIG. 6, the rising delay signal generator 111 includes a current source 211, a transistor 212, a capacitor 213, and a buffer 214. The capacitor 213 corresponds to an example of the "first capacitor."

The current source 211 adjusts a current output from a voltage source to a predetermined value. The current source 211 is, for example, a current mirror. A degree of adjustment of a current in the current source 211 is variable.

The emitter of the transistor 212 is connected to the current source 211 and the collector is connected to the ground (GND). The data signal output from the TIA 102 is input to the base of the transistor 212. In the drawing, a configuration employing a pnp transistor is illustrated, but the same operation is obtained using even a p-type metal oxide semiconductor (MOS) transistor.

A path extending from the emitter of the transistor 212 is connected to the capacitor 213 and the buffer 214. The capacitor 213 is disposed between the emitter of the transistor 212 and the GND.

When the data signal is low, the transistor 212 is turned on. In this case, charges accumulated in the capacitor 213 flow as indicated by path A2 and discharging of the capacitor 213 is carried out at a high speed.

When the data signal is high, the transistor 212 is turned off. In this case, a predetermined current flows by the current source 211 as indicated by path A1. Accordingly, the capacitor 213 is charged at a low speed. The buffer 214 identifies the voltage of the capacitor 213 using a predetermined threshold value and outputs the decision result as a rising delay signal.

Here, the value of the predetermined current which is adjusted by the current source 211 is determined to take time for charging of the capacitor 213 using path A1. That is, the charging of the capacitor 213 using path A1 is slow but the discharging of the capacitor 213 using path A2 is fast. Since the discharging of the capacitor 213 is fast, the falling is performed in an instant. Since the charging is slow, time is taken until the data signal is high and the rising timing is shifted back.

Figure 7:
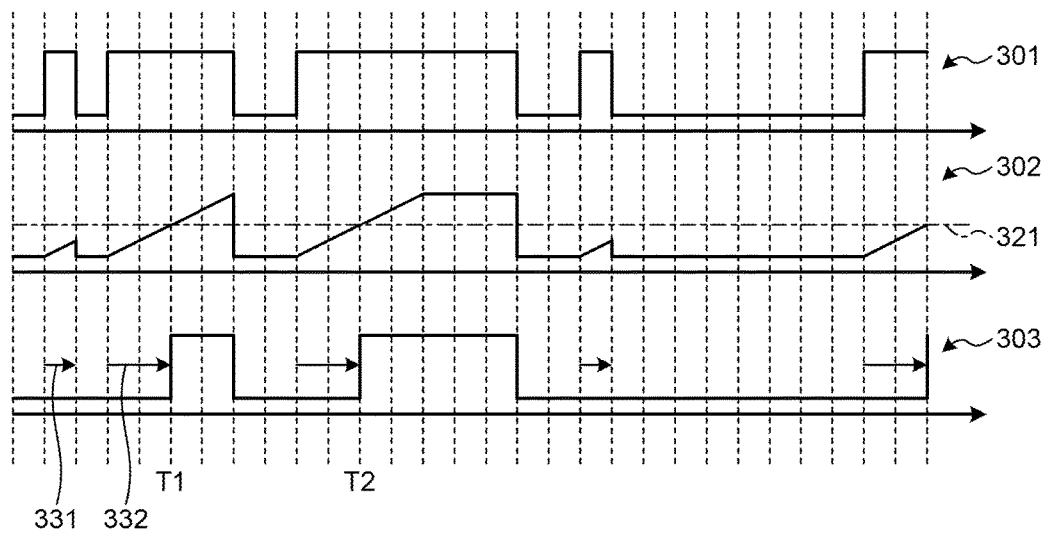
FIG. 7 is a diagram illustrating generation of a rising delay signal.

FIG. 7 is a diagram illustrating generation of a rising delay signal. In FIG. 7, the vertical axis represents a voltage and the horizontal axis represents the lapse of time.

Here, it is assumed that a signal indicated by the same graph 301 as in FIG. 5 is input from the TIA 102. When a data signal having the waveform of graph 301 is input to the transistor 212, the transistor 212 is turned off at the rising of graph 301 and then the voltage relevant to the buffer 214 slowly rises. That is, the signal input to the buffer 214 slowly rises. The signal input to the buffer 214 is indicated by graph 302.

Here, a threshold value 321 of graph 302 is a threshold value which is used to perform decision by the buffer 214. That is, the buffer 214 determines to be low when the voltage of the input signal is less than the threshold value 321, and determines to be high when the voltage of the input signal is equal to or greater than the threshold value 321. The result of the rising delay signal which is generated by decision by the buffer 214 using the threshold value 321 is indicated by graph 303. For example, since discharging is performed before the first rising of graph 301 becomes equal to or greater than the threshold value 321, the rising edge of the rising delay signal indicated by graph 303 is crushed as indicated by arrow 331. Since the falling occurs after the rising becomes equal to or greater than the threshold value 321, the rising corresponding to the second rising of graph 301 in the rising delay signal indicated by graph 303 is shifted as indicated by arrow 332. Similarly, the rising edge of the rising delay signal is crushed or shifted as indicated by another arrow. As a result, the rising delay signal indicated by graph 303 rises at only time T1 and time T2.

In FIG. 7, the rising timing is delayed by two bits, but the degree of delay of the rising timing can be adjusted by a current flowing from the current source 211. By adjusting the current of the current source 211, for example, it is possible to further delay the rising timing and to increase the number of rising edges serving as a reference when it is determined that a high part succeeds. On the other hand, for example, when the rising timing is further advanced, it is possible to reduce the number of rising edges serving as a reference when it is determined that a high part succeeds. The current source 211 corresponds to an example of the "first current source." The current flowing from the current source 211 corresponds to an example of the "first predetermined value."

Figure 8:
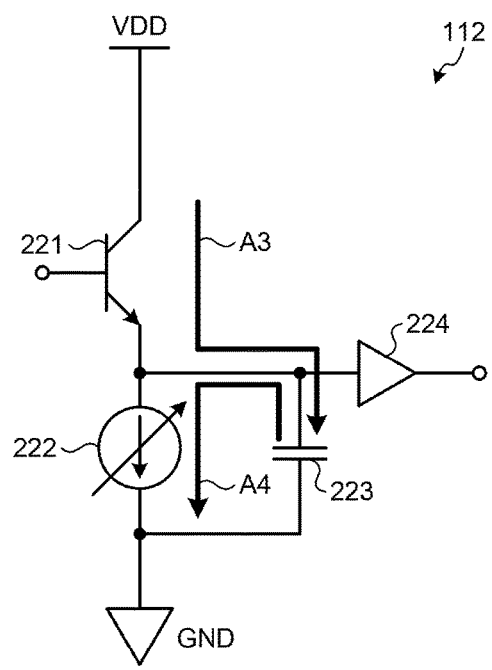
FIG. 8 is a circuit diagram illustrating an example of a falling delay signal generator.

Details of the operation of the falling delay signal generator 112 as an example of the "second signal generator" will be described below with reference to FIG. 8. FIG. 8 is a circuit diagram illustrating an example of the falling delay signal generator. For example, as illustrated in FIG. 8, the falling delay signal generator 112 includes a transistor 221, a current source 222, a capacitor 223, and a buffer 224. The capacitor 223 corresponds to an example of the "second capacitor."

The collector of the transistor 221 is connected to a voltage source and the emitter thereof is connected to the current source 222 and the GND. The data signal output from the TIA 102 is input to the base of the transistor 221. In the drawing, a configuration employing an npn transistor is illustrated, but the same operation is obtained using even an n-type MOS transistor.

A path extending from the emitter of the transistor 221 is connected to the capacitor 223 and the buffer 224. The capacitor 223 is disposed between the emitter of the transistor 221 and the GND.

The current source 222 adjusts a current discharged from the capacitor 223 to a predetermined value. The current source 222 is, for example, a current mirror. A degree of adjustment of a current in the current source 222 is variable.

When the data signal is high, the transistor 221 is turned on. In this case, the current output from the voltage source flows as indicated by path A3. Accordingly, the capacitor 223 is charged at a high speed. The buffer 224 identifies the voltage of the capacitor 223 using a predetermined threshold value and outputs the decision result as a falling delay signal.

When the data signal is low, the transistor 221 is turned off. In this case, charges accumulated in the capacitor 223 flow as indicated by path A4 and discharging of the capacitor 223 is carried out at a low speed.

Here, the value of the predetermined current which is adjusted by the current source 222 is determined to take time for discharging of the capacitor 223 using path A4. That is, the charging of the capacitor 223 using path A4 is slow but the charging of the capacitor 223 using path A3 is fast. Since the charging of the capacitor 223 is fast, the rising of the signal input to the buffer 224 is performed in an instant. Since the discharging of the capacitor 223 is slow, time is taken until the buffer 224 determines that the data signal is low, and the falling timing is shifted back.

Figure 9:
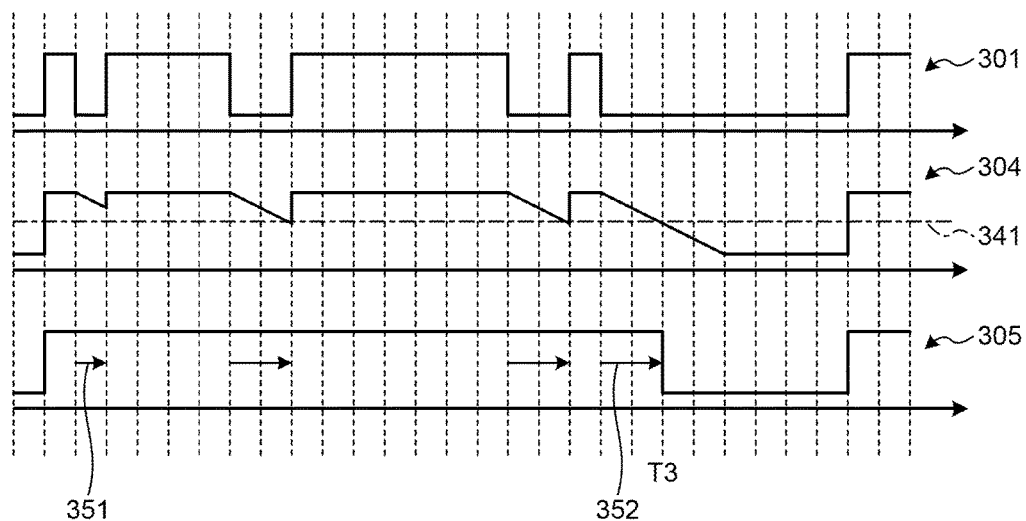
FIG. 9 is a diagram illustrating generation of a falling delay signal.

FIG. 9 is a diagram illustrating generation of a falling delay signal. In FIG. 9, the vertical axis represents a voltage and the horizontal axis represents the lapse of time.

Here, it is assumed that a signal indicated by the same graph 301 as in FIG. 5 is input from the TIA 102. When a data signal having the waveform of graph 301 is input to the transistor 221, the transistor 221 is turned on at the rising of graph 301. The transistor 221 is turned off at the falling timing of graph 301. Thereafter, the voltage relevant to the buffer 224 slowly falls. That is, the signal input to the buffer 224 slowly falls. The signal input to the buffer 224 is indicated by graph 304.

Here, a threshold value 341 of graph 304 is a threshold value which is used to perform decision by the buffer 224. That is, the buffer 224 determines to be low when the voltage of the input signal is less than the threshold value 341, and determines to be high when the voltage of the input signal is equal to or greater than the threshold value 341. The result of the falling delay signal which is generated by decision by the buffer 224 using the threshold value 341 is indicated by graph 305. For example, since charging is started before the first falling of graph 301 becomes less than the threshold value 341, the falling edge of the falling delay signal indicated by graph 305 is crushed as indicated by arrow 351. Since the falling occurs after the falling becomes less than the threshold value 341, the falling corresponding to the fourth falling of graph 301 in the falling delay signal indicated by graph 305 is shifted as indicated by arrow 352. Similarly, the falling edge of the falling delay signal is crushed or shifted as indicated by another arrow. As a result, the falling delay signal indicated by graph 305 falls at only time T3.

In FIG. 9, the falling timing is delayed by two bits, but the degree of delay of the falling timing can be adjusted by a current flowing from the current source 222. By adjusting the current of the current source 222, for example, it is possible to further delay the falling timing and to increase the number of falling edges serving as a reference when it is determined that a low part succeeds. On the other hand, for example, when the falling timing is further advanced, it is possible to reduce the number of rising edges serving as a reference when it is determined that a low part succeeds. The current source 222 corresponds to an example of the "second current source." The current flowing from the current source 222 corresponds to an example of the "second predetermined value."

As described above, it is possible to change a degree of delay of the rising by changing the current flowing from the current source 211, and it is possible to change a degree of delay of the falling by changing the current flowing from the current source 222. That is, by changing the degrees of delay of the rising and the falling, it is possible to adjust the number of identical digits serving as a reference for detecting succession of identical digits. Accordingly, it is possible to adjust the period in which the identical digit detection signal generated by the identical digit detector 110 is in the high state. That is, the period in which the identical digit detection signal is in the high state is extended when the number of identical digit serving as a determination reference decreases, and the period in which the identical digit detection signal is in the high state is shortened when the number of identical digits serving as a determination reference increases.

When the period in which the identical digit detection signal is in the high state is extended, the operation of the charge pump 107 is not stopped until multiple identical digits succeed. In this case, the receiving-side optical module 100 can generate a clock signal to accurately correspond to the sign change, but coping performance with a phase shift of the clock signal due to succession of identical digits degrades. On the other hand, when the period in which the identical digit detection signal is in the high state is shortened, the operation of the charge pump 107 is stopped due to slight succession of identical digit. In this case, the receiving-side optical module 100 is improved in coping performance with the phase shift of the clock signal due to the succession of identical digits, but degrades in coping precision with the sign change. Accordingly, it is preferable that the currents which are adjusted by the current sources 211 and 222 be determined by balance of the coping performance with the phase shift due to succession of identical digits with the coping accuracy with the sign change.

Figure 10:
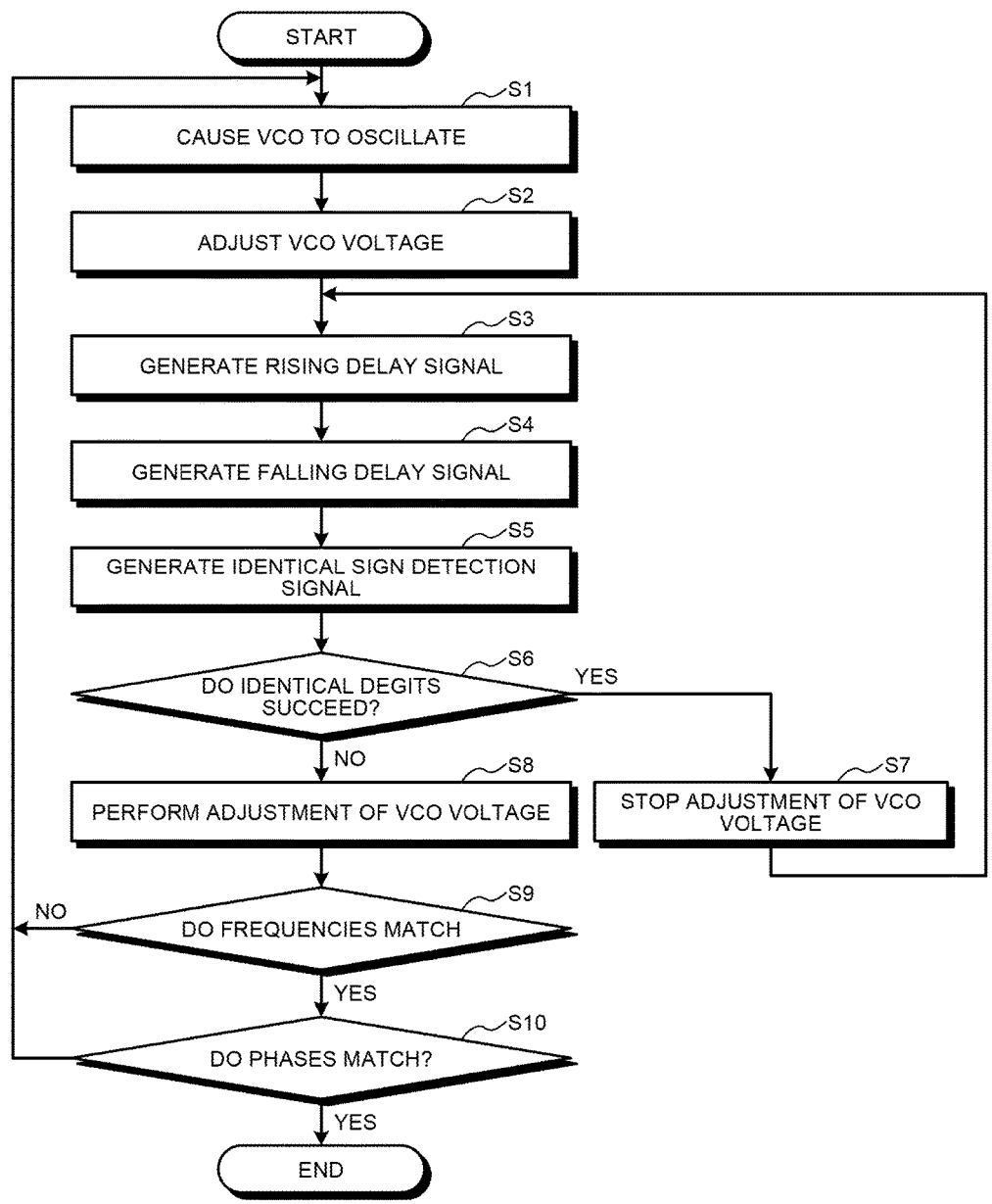
FIG. 10 is a flowchart illustrating a clock recovery process in a clock repeat circuit.

A flow of a clock recovery process in the receiving-side optical module 100 will be described below with reference to FIG. 10. FIG. 10 is a flowchart illustrating the clock recovery process in the clock repeat circuit. The flow of the clock recovery process is the same as in the transmitting-side optical module or an electrical signal clock recovery circuit.

The VCO 105 oscillates on the basis of a voltage input from the loop filter 108 and generates a clock signal (step S1).

Then, the charge pump 107 adjusts the voltage to be input to the VCO 105 on the basis of the signal input from the phase and frequency detector 106 (step S2).

Then, the rising delay signal generator 111 of the identical digit detector 110 generates a rising delay signal (step S3). The falling delay signal generator 112 of the identical digit detector 110 generates a falling delay signal (step S4).

Thereafter, the OR circuit 115 of the identical digit detector 110 receives an input of the rising delay signal and an input of the falling delay signal. Then, the OR circuit 115 generates an identical digit detection signal (step S5).

The identical digit detector 110 determines whether identical digits succeed on the basis of the sign of the generated identical digit detection signal (step S6). When identical digits succeed (YES in step S6), the identical digit detector 110 stops the operation of the charge pump 107 and stops the adjustment of a voltage for the VCO 105 (step S7).

On the other hand, when identical digits do not succeed (NO in step S6), the identical digit detector 110 activates the charge pump 107 and activates the adjustment of a voltage for the VCO 105 (step S8).

Then, the phase and frequency detector 106 acquires a data signal output from the TIA 102. The phase and frequency detector 106 acquires a clock signal generated by the VCO 105. Then, the phase and frequency detector 106 determines whether the frequency of the data signal matches the frequency of the clock signal (step S9).

When the frequencies do not match each other (NO in step S9), the process flow is returned to step S1. On the other hand, when the frequencies match each other (YES in step S9), the phase and frequency detector 106 determines whether the phase of the data signal and the phase of the clock signal match each other (step S10).

When the phases do not match each other (NO in step S10), the process flow is returned to step S1. On the other hand, when the phases match each other (YES in step S10), the clock recovery circuit ends this clock adjusting operation. The process flow illustrated in FIG. 10 represents the first clock adjusting operation and the clock recovery circuit actually repeats the process flow illustrated in FIG. 10.

In the flow illustrated in FIG. 10, for the purpose of convenience of description, the processes of determining succession of identical digits illustrated in steps S3 to S6 is performed before the phases and the frequencies are compared, but these processes may be actually performed in parallel. Here, the succession of identical digits is determined by the identical digit detector 110 and the operation of the charge pump 107 is stopped, but the identical digit detector 110 may be configured to stop the operation by simply outputting the generated identical digit detection signal to the charge pump 107.

Figure 11:
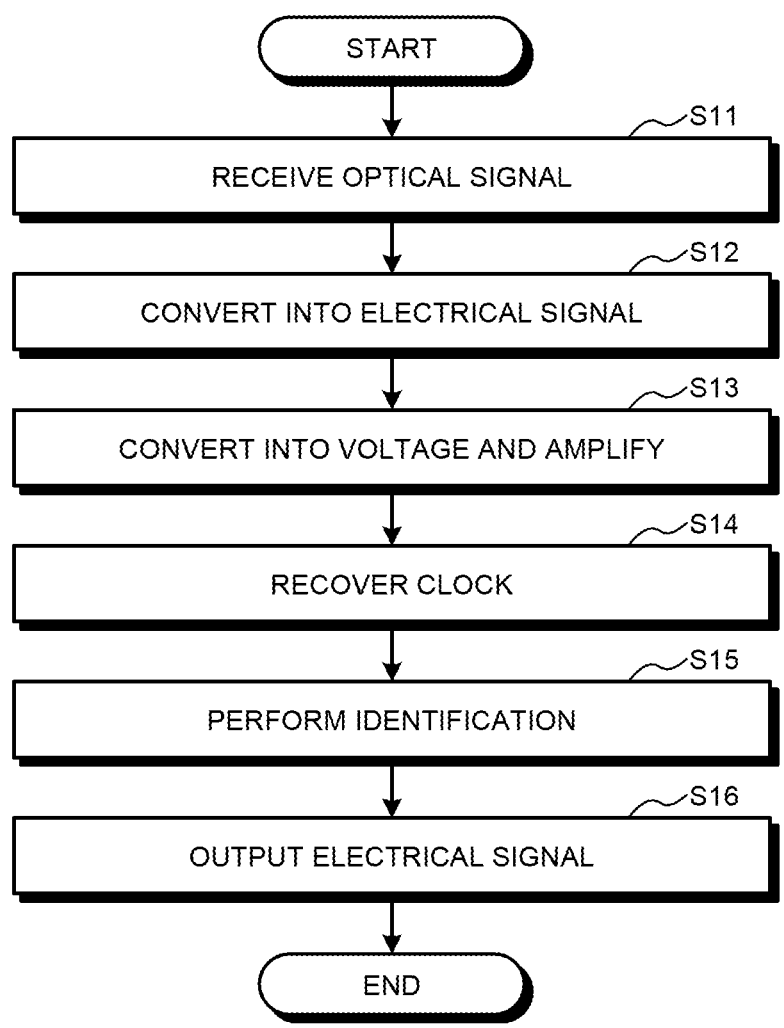
FIG. 11 is a flowchart illustrating a signal receiving process in an optical module.

A flow of a signal receiving process in the receiving-side optical module 100 will be described below with reference to FIG. 11. FIG. 11 is a flowchart illustrating a signal receiving process in an optical module.

The light-receiving element 101 receives a data signal which is an optical signal from the transmitting-side optical module 20 via an optical fiber (step S11).

Then, the light-receiving element 101 converts the received data signal into an electrical signal (step S12). Then, the light-receiving element 101 outputs the data signal converted into the electrical signal to the TIA 102.

The TIA 102 converts the received data signal into a voltage and amplifies the converted data signal (step S13). Then, the TIA 102 outputs the data signal to the decision unit 103.

The VCO 105 oscillates depending on a voltage input from the loop filter 108 and recovers a clock signal (step S14). Here, the VCO 105 receives the voltage, which is controlled by the clock recovery process illustrated in FIG. 10, from the loop filter 108.

The decision unit 103 receives an input of the data signal from the TIA 102. The decision unit 103 receives an input of the clock signal generated by the VCO 105. The decision unit 103 identifies the data signal using the clock signal (step S15). Then, the decision unit 103 outputs the data signal of which information is determined by the decision to the output buffer 104.

The output buffer 104 receives an input of the data signal of which information is determined by the decision from the decision unit 103. Then, the output buffer 104 outputs an electrical signal which is the data signal having information determined to the CPU 11 (step S16).

Figure 12:
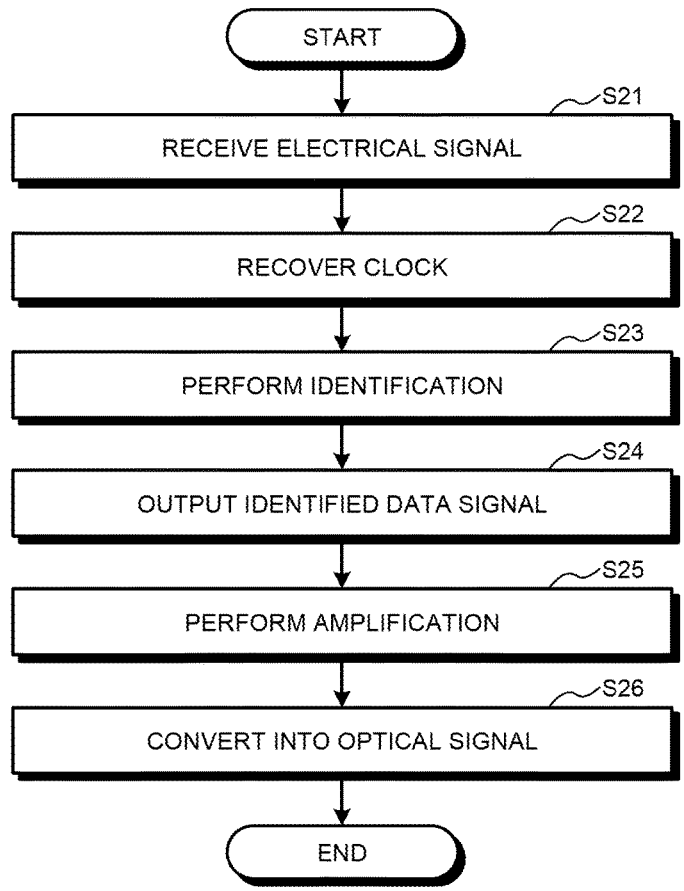
FIG. 12 is a flowchart illustrating a signal transmitting process in an optical module.

A flow of a signal transmitting process in the transmitting-side optical module 20 will be described below with reference to FIG. 12. FIG. 12 is a flowchart illustrating a signal transmitting process in an optical module.

The input buffer 21 receives a data signal which is an electrical signal from the CPU 11 (step S21). The input buffer 21 outputs the received data signal to the decision unit 103, the phase and frequency detector 106, and the identical digit detector 110.

The VCO 105 oscillates depending on a voltage input from the loop filter 108 and recovers a clock signal (step S22).

The decision unit 103 receives an input of the data signal from the input buffer 21. The decision unit 103 receives an input of the recovered clock signal from the VCO 105. Then, the decision unit 103 identifies the data signal using the received recovered clock signal (step S23). Thereafter, the decision unit 103 outputs the identified data signal to the driver 23 (step S24).

The driver 23 receives an input of the identified data signal from the decision unit 103. The driver 23 amplified the received data signal (step S25). Thereafter, the driver 23 outputs the data signal to the light-emitting element 24.

The light-emitting element 24 receives an input of the data signal from the driver 23. Then, the light-emitting element 24 converts the data signal as an electrical signal into an optical signal (step S26). Then, the light-emitting element 24 transmits the data signal converted into the optical signal to the receiving-side optical module 100.

Figure 13:
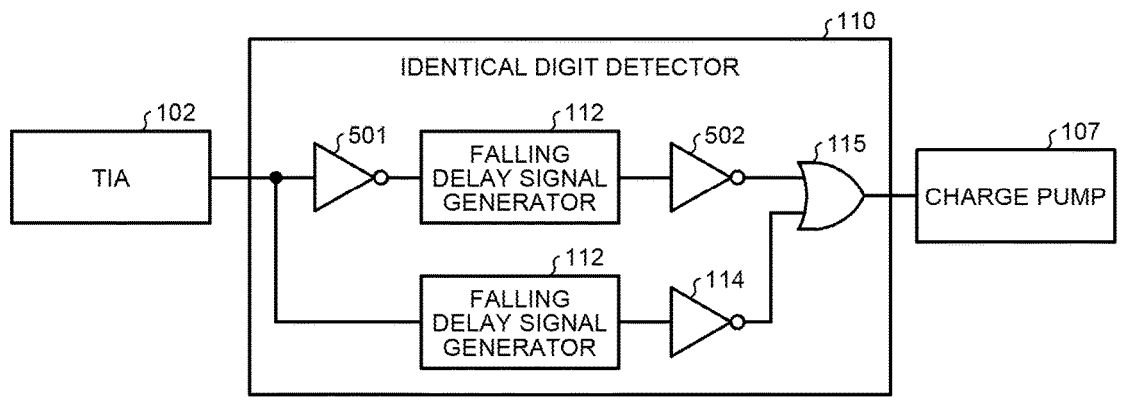
FIG. 13 is a block diagram when a falling delay circuit is used as a "first signal generator" and a "second signal generator"

FIG. 13 is a block diagram when the falling delay circuit is used as the "first signal generator" and the "second signal generator." Here, the falling delay circuit is a circuit illustrated in FIG. 8. Here, the functions of the rising delay signal generator 111 and the buffer 113 are realized by the buffer 501, the falling delay signal generator 112, and the buffer 502.

FIG. 14 is a diagram illustrating a simulation result of an identical digit detection signal in the clock recovery circuit when the identical digit detector illustrated in FIG. 13 is used. In graphs 401 to 404 of FIG. 14, the vertical axis represents a voltage and the horizontal axis represents a time.

Graph 401 indicates a waveform of a data signal input to the identical digit detector 110. In the simulation illustrated in FIG. 14, it is assumed that a signal having a waveform in which a time in which an identical digit succeeds gradually increases is input to the receiving-side optical module 100 as indicated by graph 401.

In this configuration, the first signal in which the rising timing is delayed by the first time and the second signal in which the falling timing is delayed by the second time are generated using the falling delay signal generator 112. That is, by inputting the signal indicated by graph 401 to the falling delay signal generator 112, the falling delay signal can be acquired. By inverting the signal indicated by graph 401, the falling and the rising are inverted. Therefore, by inputting the signal which is obtained by inverting the signal indicated by graph 401 to the falling delay signal generator 112, a signal which is obtained by inverting the rising delay signal which is generated when graph 401 is input to the rising delay signal generator 111 can be acquired.

Graph 402 is a graph indicating the signal in which the rising delay signal is inverted and a falling delay signal. In graph 402, the graph indicated by a dotted line indicates a signal in which the rising delay signal is inverted. In graph 402, the graph indicated by a solid line is the falling delay signal. As indicated by graph 402, the signal in which the rising delay signal is inverted gradually falls in voltage in a part corresponding to the rising of graph 401. The falling delay signal gradually falls in voltage in a part corresponding to the falling of graph 401.

Graph 403 is a graph indicating the falling delay signal and the signal in which the rising delay signal of graph 402 is inverted. That is, graph 403, the graph indicated by a dotted line indicates the rising delay signal. In graph 403, the graph indicated by a solid line is a graph which is obtained by inverting the falling delay signal.

Two signals indicated by graph 403 are input to the OR circuit 115 of the identical digit detector 110. The identical digit detection signal output from the OR circuit 115 is the signal indicated by graph 404. A part in which the signal indicated by graph 404 is in the high state represents that an identical digit succeeds. Here, it can be seen that graph 404 is in the high state in the part corresponding to the signal in which multiple identical digits succeed in graph 401. That is, it can be seen that the identical digit detector 110 according to this embodiment accurately detects succession of an identical digit.

FIG. 15 is a diagram illustrating a simulation result of an identical digit detection signal when the delay time is changed. In graphs 411 and 412 of FIG. 15, the vertical axis represents a voltage and the horizontal axis represents a time. In graphs 413 and 414, the vertical axis represents a current and the horizontal axis represents a time.

Graph 411 is the same signal as graph 401 in FIG. 14 and indicates a waveform of a data signal input to the identical digit detector 110.

Waveforms in graph 412 indicate the identical digit detection signals when the delay time is changed by adjusting currents flowing from the current sources 211 and 222. As indicated by graph 412, since the slope of the rising is changed in the waveforms, it can be seen that the delay time is changed.

Graph 413 is a graph indicating the operation of the charge pump 107 when the charge pump 107 in which a current of 20 ($\mu$A) is controlled using signals corresponding to the waveforms in graph 412. In graph 413, when the current is 0 (A), the operation of the charge pump 107 is stopped. For example, it can be seen that the charge pump 107 is stopped in the part indicated by area 431.

Graph 414 is a graph indicating the operation of the charge pump 107 when the charge pump 107 in which a current of 25 ($\mu$A) is controlled using the signals corresponding to the waveforms in graph 412. In graph 414, when the current is 0 (A), the operation of the charge pump 107 is stopped. For example, it can be seen that the charge pump 107 is stopped in the part indicated by area 441.

In any of graphs 413 and 414, it can be seen that the shorter the delay time becomes, the longer the time in which the charge pump 107 is stopped becomes. In a part having small succession of identical digits in graph 401, it can be seen that the charge pump 107 performs its normal operation in any of graphs 413 and 414.

FIG. 16 is a block diagram when the rising delay circuit is used as the "first signal generator" and the "second signal generator." Here, the rising delay circuit is a circuit illustrated in FIG. 6. Here, the functions of the falling delay signal generator 112 and the buffer 114 are realized by the buffer 511, the rising delay signal generator 111, and the buffer 512.

FIG. 17 is a diagram illustrating a simulation result of an identical digit detection signal in the clock recovery circuit when the rising delay signal generator is used. That is, the simulation is performed using a falling delay circuit which is the falling delay signal generator 112 in FIGS. 14 and 15, but the simulation is performed using a rising delay circuit which is the rising delay signal generator 111 in FIG. 17.

Graph 421 indicates a waveform of a data signal input to the identical digit detector 110. Graph 422 indicates the rising delay signal which is generated by the rising delay signal generator 111 using a signal having a waveform indicated by graph 421 and a signal in which the falling delay signal is inverted. Here, the rising delay signal is indicated by a dotted line and the signal in which the falling delay signal is inverted is indicated a solid line.

In this case, similarly to the falling delay signal generator 112, signals in which the rising and the falling are appropriately delayed are generated. That is, in this simulation, similarly to a case in which the falling delay signal generator 112 is used, it can be seen that an appropriate identical digit detection signal is generated.

As described above, the clock recovery circuit according to this embodiment detects that an identical digit of the data signal succeeds and stops the operation of the charge pump. Accordingly, it is possible to suppress occurrence of a phase shift of a clock signal due to succession of identical digits and to reduce degradation in transmission quality such as a bit error.

A method of detecting the succession of identical digits using edge detection can be considered, but in case of high-speed data communication such as optical interconnection, a pulse becomes finer than 1 bit, a response to identical digit detection is not immediate, and an increase in speed is difficult. On the other hand, since the clock recovery circuits according to the above-mentioned embodiments detect succession of identical digits without using the edge detection, it is possible to implement an increase in detection speed. Since the rising delay time and the falling delay time are variable, it is possible to adjust the length of the succession of identical digits to be detected.

According to one aspect of the clock recovery circuit, the optical module, and the clock recovery method disclosed in the present application, it is possible to reduce degradation in transmission quality in data communication.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A clock recovery circuit comprising:
   a voltage-controlled oscillator that generates a clock signal;
   a phase and frequency detector that compares phases and frequencies of the clock signal generated by the voltage-controlled oscillator and an input signal;
   a voltage adjuster that adjusts a control voltage of the voltage-controlled oscillator based on an output of the phase and frequency detector;
   a first signal generator that generates a first signal by delaying a rising timing of the input signal by a first time;
   a second signal generator that generates a second signal by delaying a falling timing of the input signal by a second time; and
   a controller that detects succession of identical digits in the input signal based on the first signal and the second signal and stops adjustment of the control voltage by the voltage adjuster when identical digits succeed by a predetermined number of identical digits or more.

2. The clock recovery circuit according to claim 1, wherein the controller detects the succession of identical digits in the input signal by logical OR of the first signal and a signal obtained by inverting the second signal.

3. The clock recovery circuit according to claim 1, wherein the first signal generator generates the first signal by outputting a signal while charging or discharging a first capacitor thereof at a low speed when the input signal is in a high state and outputting a signal while charging or discharging charges accumulated in the first capacitor at a high speed to output a voltage when the input signal in a low state.

4. The clock recovery circuit according to claim 3, wherein the first signal generator includes a first current source that adjusts a charging/discharging current of the first capacitor to a first predetermined value and the first time is changed by changing the first predetermined value.

5. The clock recovery circuit according to claim 1, wherein the second signal generator generates the second signal by outputting a signal while charging or discharging a second capacitor thereof at a high speed when the input signal is in a high state and outputting a signal while charging or discharging charges accumulated in the second capacitor at a low speed when the input signal in a low state.

6. The clock recovery circuit according to claim 5, wherein the second signal generator includes a second current source that adjusts a charging/discharging current of the second capacitor to a second predetermined value and the second time is changed by changing the second predetermined value.

7. The clock recovery circuit according to claim 1, wherein the first time in the first signal generator is variable.

8. The clock recovery circuit according to claim 1, wherein the second time in the second signal generator is variable.

9. An optical module comprising:
   a light-receiving element that receives an input of an optical signal and converts the optical signal into a current to generate an input signal;
   a voltage-controlled oscillator that generates a clock signal;
   a phase and frequency detector that compares phases and frequencies of the clock signal generated by the voltage-controlled oscillator and an input signal;
   a voltage adjuster that adjusts a control voltage of the voltage-controlled oscillator based on an output of the phase and frequency detector;
   a first signal generator that generates a first signal by delaying a rising timing of the input signal by a first time;
   a second signal generator that generates a second signal by delaying a falling timing of the input signal by a second time;
   a controller that detects succession of identical digits in the input signal based on the first signal and the second signal and stops adjustment of the control voltage by the voltage adjuster when identical digits succeed by a predetermined number of identical digits or more;

a decision unit that identifies the input signal based on the clocks signal recovered by the voltage-controlled oscillator and generates a decision signal; and an output unit that outputs the decision signal.

10. A clock recovery method comprising:

comparing phases and frequencies of a clock signal generated by a voltage-controlled oscillator and an input signal;

adjusting a control voltage of the voltage-controlled oscillator based on the comparison result;

generating a first signal by delaying a rising timing of the input signal by a first time;

generating a second signal by delaying a falling timing of the input signal by a second time;

detecting succession of identical digits in the input signal based on the first signal and the second signal;

stopping adjustment of the control voltage by the voltage-controlled oscillator when identical digits succeed by a predetermined number of identical digits or more; and generating a clock signal from the voltage-controlled oscillator based on the control voltage.

* * * * *